United States Patent [19]
Kobayashi et al.

[11] Patent Number: 6,136,500
[45] Date of Patent: Oct. 24, 2000

[54] RADIATION SENSITIVE RESIN COMPOSITION

[75] Inventors: Eiichi Kobayashi; Makoto Shimizu; Takayoshi Tanabe; Shin-ichiro Iwanaga, all of Yokkaichi, Japan

[73] Assignee: JSR Corporation, Tokyo, Japan

[21] Appl. No.: 09/135,855

[22] Filed: Aug. 18, 1998

[30] Foreign Application Priority Data

Aug. 18, 1997 [JP] Japan .................................. 9-235495

[51] Int. Cl.$^7$ ............................ G03F 7/038; G03F 7/039
[52] U.S. Cl. .................. 430/270.1; 430/914; 430/921
[58] Field of Search ............................... 430/270.1, 914, 430/921

[56] References Cited

U.S. PATENT DOCUMENTS

| | | | |
|---|---|---|---|
| 5,376,496 | 12/1994 | Elsaesser et al. | 430/165 |
| 5,648,195 | 7/1997 | Sebalid et al. | 430/170 |
| 5,663,035 | 9/1997 | Masuda et al. | 430/270.1 |

FOREIGN PATENT DOCUMENTS

| | | |
|---|---|---|
| 0 440 086 | 8/1991 | European Pat. Off. . |
| 0 677 788 | 10/1995 | European Pat. Off. . |
| 43 23 289 | 1/1995 | Germany . |
| 27660 | 4/1990 | Japan . |
| 161436 | 10/1990 | Japan . |
| 44290 | 3/1991 | Japan . |
| 249682 | 9/1993 | Japan . |
| 140666 | 7/1995 | Japan . |
| 43834 | 2/1997 | Japan . |

*Primary Examiner*—Janet Baxter
*Assistant Examiner*—Rosemary Ashton
*Attorney, Agent, or Firm*—Oblon, Spivak, McClelland, Maier & Neustadt, P.C.

[57] ABSTRACT

Positive as well as negative radiation sensitive resin compositions that, in addition to being capable of providing excellent resolution and pattern profile, are particularly excellent in avoiding the problems of "nano-edge roughness" or "coating surface roughness". The positive type radiation sensitive resin composition comprises (A) (a) an acid-decomposable group-containing resin, or (b) an alkali-soluble resin and an alkali dissolution controller, and (B) a photoacid generator comprising "a compound that upon exposure to radiation generates a carboxylic acid having a boiling point of 150° C. or higher", and "a compound that upon exposure to radiation generates an acid other than a carboxylic acid". The negative type radiation sensitive resin composition comprises (C) an alkali-soluble resin, (D) a cross-linking agent, and the component (B) as described above.

12 Claims, 1 Drawing Sheet

RADIATION SENSITIVE RESIN COMPOSITION

BACKGROUND OF THE INVENTION

1. Field of the Invention

This invention relates to a radiation sensitive resin composition. More specifically, this invention relates to a radiation sensitive resin composition that is useful in the manufacture of positive and negative type resists suitable for microfabrication using various kinds of radiation. The composition contains a photoacid generator comprising a combination of a compound that generates a carboxylic acid upon exposure to radiation and another compound that generates another acid upon exposure to radiation.

2. Description of Background Art

In the field of microfabrication, as exemplified in the manufacture of an integrated circuit device, a rapidly progressing trend is to establish design rules for products with finer dimensions by the lithographic process with the aim of attaining higher degrees of circuit integration. Development of a lithographic process that is capable of reliably performing microfabrication with precision for a line width of 0.5 μm or less has thus been vigorously pursued in recent years.

The above development also calls for preparation of microfabrication resists with the capability of accurately forming resist patterns with a line width of 0.5 μm or less. However, drawing such a minute pattern with high enough precision is very difficult with the conventional process based on visible rays (wavelength: 700–400 nm) or near ultraviolet rays (400–300 nm). For this reason, lithographic processes based on radiation with a shorter wavelength (300 nm or less) that is capable of achieving a greater focal depth and being effective for establishing design rules for products with finer dimensions have been proposed.

As the lithographic processes using such short wavelength radiation, for example, methods based on a bright-line spectrum of mercury-vapor light (wavelength: 254 nm), a KrF excimer laser (wavelength: 248 nm), an ArF excimer laser (wavelength: 193 nm), X-rays such as synchrotron radiation, or charged particle radiation such as electron beams are being proposed. In addition, a "chemically amplified resist" has been proposed as a high-resolution resist suitable for use with such short wavelength radiation. Improvements in the chemically amplified resist are now being actively pursued.

With a chemically amplified resist, acid is generated when the photoacid generator contained in such a resist is irradiated (a process hereafter termed "exposure"). The acid thus generated acts as a catalyst to trigger chemical reactions such as alteration of polarity, cleavage of chemical bonds, or cross-linking within the exposed part of the resist film. The resulting change in solubility characteristics of the exposed part to a developing solution can then be utilized to develop a pattern.

Various disclosures have been made in the past for such a chemically amplified resist, including resists based on resins wherein (1) an alkali affinitive group in the alkali soluble resin is protected by a t-butyl ester group or t-butoxycarbonyl group (see Japanese Patent Publication No. 27660/1990); (2) an alkali affinitive group in the alkali soluble resin is protected by a silyl group (see Japanese Patent Publication No. 44290/1991); (3) an alkali affinitive group in the alkali soluble resin is protected by a ketal group (see Japanese Patent Application Laid-Open No. 140666/1995); and (4) an alkali affinitive group in the alkali soluble resin is protected by an acetal group (see Japanese Patent Application Laid-Open No. 161436/1990 and Japanese Patent Application Laid-Open No. 249682/1993).

However, it has been pointed out that each of these chemically amplified resists has a peculiar drawback, giving rise to various obstacles for actual application to microfabrication, especially with a critical design dimension of 0.25 μm or less. In most recent years, reports have begun to appear on problems in microfabricating with a critical design dimension of approximately 0.20 μm at a film thickness of 0.5 μm or less. These so-called "nano-edge roughness" or "coating surface roughness" problems are caused by excessive unevenness of the surface and the lateral faces of a resist after pattern formation, hampering microfabrication according to the designed critical dimension.

Meanwhile, concerning radiation sensitive resin compositions of positive as well as negative types, it has been disclosed that line width control can be made easier by using as a photosensitive compound a combination of a photoacid generator and a compound that can be decomposed into a neutral substance upon irradiation (see Japanese Patent Application Laid-Open No. 43837/1997). However, although such a composition excels in resolution, heat resistance, or etching endurance, it has insufficient performance particularly in the matter of "nano-edge roughness" or "coating surface roughness". Therefore, development of a chemically amplified resist that not only exhibits excellent resolution, pattern profile, or other performance but also has the capability of solving the problems of "nano-edge roughness" or "coating surface roughness" is strongly desired.

Accordingly, an object of the present invention is to provide a radiation sensitive resin composition suitable as a chemically amplified resist of either a positive or negative type that effectively responds to various types of radiation such as far ultraviolet rays, X-rays, or charged particle beams. Such a resist is, in addition to having excellent resolution as well as pattern profile, capable of reliably forming highly accurate and minute resist patterns, specifically without causing "nano-edge roughness" or "coating surface roughness".

SUMMARY OF THE INVENTION

According to the present invention, the above object can be achieved by a positive type radiation sensitive resin composition comprising:

(A) (a) an alkali-insoluble or alkali low-soluble resin protected by an acid-decomposable group and turning alkali-soluble when said acid-decomposable group is decomposed or (b) an alkali-soluble resin and an alkali dissolution controller; and (B) a photoacid generator comprising two or more chemical compounds, one being a compound which upon exposure to radiation generates a carboxylic acid having a boiling point of 150° C. or higher under atmospheric pressure and the other a compound which upon exposure to radiation generates an acid other than a carboxylic acid (the resin composition described above is hereafter referred to as "positive tone resin composition").

According to the present invention, the above object can further be achieved by a negative type radiation sensitive resin composition comprising:

(C) an alkali-soluble resin, (D) a compound capable of cross-linking an alkali-soluble resin in the presence of an acid, and (B) a photoacid generator comprising two or more chemical compounds, one being a compound which upon exposure to radiation generates a carboxylic acid having a boiling point of 150° C. or higher under atmospheric pressure and the other a compound which upon exposure to radiation generates an acid other than a carboxylic acid (the resin composition described above is hereafter referred to as "negative tone resin composition").

Other and further objects, features and advantages of the present invention will appear more fully from the following description.

DETAILED DESCRIPTION OF THE INVENTION AND PREFERRED EMBODIMENTS

Figure 1:
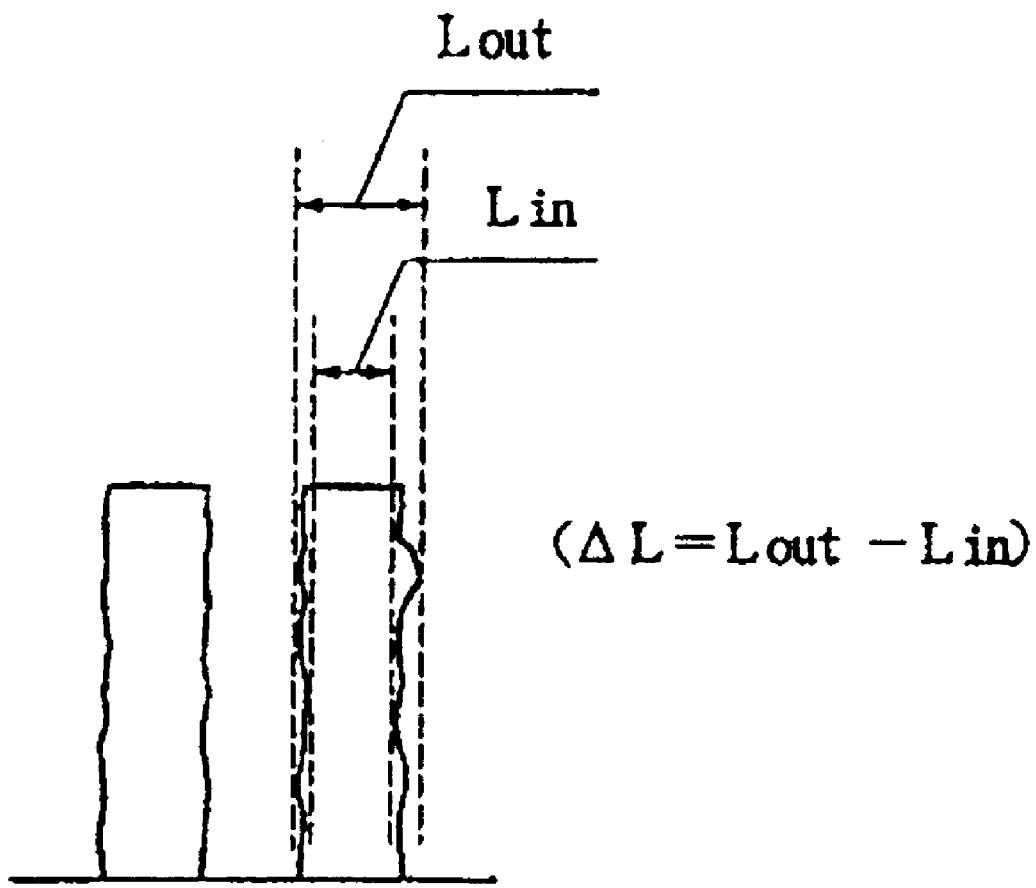
FIG. 1 is sectional side dimensions of a resist pattern illustrating the evaluation method for the coating surface roughness.

The various components from which the positive tone resin composition and negative tone resin composition of the present invention are prepared will now be described in detail.

Acid-decomposable Group-containing Resin

The alkali-insoluble or alkali low-soluble resin protected by an acid-decomposable group, which turns alkali-soluble when said acid-decomposable group is decomposed, to be used in the positive tone resin composition (as the component (A) (a)) (hereinafter referred to as the "acid-decomposable group-containing resin") is a resin which is in itself alkali-insoluble or alkali low-soluble. Hydrogen atoms in the acidic functional groups of such a resin containing one or more acidic functional groups such as a phenolic hydroxyl group, carboxylic group, and the like are replaced with one or more types of acid-decomposable groups that can be decomposed in the presence of an acid. The characteristic of a resin being "alkali-insoluble or alkali low-soluble" mentioned above is defined as the feature to retain 50% or more of the initial film thickness of a resist coating which is formed based only on the acid-decomposable group-containing resin, in lieu of the resin composition of the present invention, and developed under the alkaline developing conditions to be employed when a resist pattern is formed from a resist coating comprising a radiation sensitive resin composition containing an acid-decomposable group-containing resin.

As the aforementioned acid-decomposable group in an acid-decomposable group-containing resin, there can be mentioned, for example, substituted methyl groups, 1-substituted ethyl groups, 1-branched alkyl groups, silyl groups, germyl groups, alkoxycarbonyl groups, acyl groups, and cyclic acid-decomposable groups.

Given as specific examples of the above-mentioned substituted methyl groups are a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, isopropoxycarbonylmethyl group, n-butoxycarbonylmethyl group, and t-butoxycarbonylmethyl group.

Given as specific examples of the above-mentioned 1-substituted ethyl groups are a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-isopropoxycarbonylethyl group, 1-n-butoxycarbonylethyl group, and 1-t-butoxycarbonylethyl group.

Given as specific examples of the above-mentioned 1-branched alkyl groups are an isopropyl group, sec-butyl group, t-butyl group, 1,1-dimethylpropyl group, 1-methylbutyl group, and 1,1-dimetylbutyl group.

Given as specific examples of the above-mentioned silyl groups are trimethylsilyl group, ethyldimethylsilyl group, methyldiethylsilyl group, triethylsilyl group, isopropyldimethylsilyl group, methyldiisopropylsilyl group, triisopropylsilyl group, t-butyldimethylsilyl group, methyl-di-t-butylsilyl group, tri-t-butylsilyl group, phenyldimethylsilyl group, methyldiphenylsilyl group, and triphenylsilyl group.

Given as specific examples of the above-mentioned germyl groups are a trimethylgermyl group, ethyldimethylgermyl group, methyldiethylgermyl group, triethylgermyl group, isopropyldimethylgermyl group, methyl-di-isopropylgermyl group, triisopropylgermyl group, t-butyldimethylgermyl group, methyl-di-t-butylgermyl group, tri-t-butylgermyl group, phenyldimethylgermyl group, methyldiphenylgermyl group, and triphenylgermyl group.

Given as specific examples of the above-mentioned alkoxycarbonyl groups are a methoxycarbonyl group, ethoxycarbonyl group, isopropoxycarbonyl group, and t-butoxycarbonyl group.

Given as specific examples of the above-mentioned acyl groups are acetyl group, propionyl group, butyryl group, heptanoyl group, hexanoyl group, valeryl group, pivaloyl group, isovaleryl group, lauroyl group, myristoyl group, palmitoyl group, stearoyl group, oxalyl group, malonyl group, succinyl group, glutaryl group, adipoyl group, pieroyl group, suberoyl group, azelaoyl group, sebacoyl group, acryloyl group, propioloyl group, methacryloyl group, crotonoyl group, oleoyl group, maleoyl group, fumaroyl group, methaconoyl group, camphoroyl group, benzoyl group, phthaloyl group, isophthaloyl group, telephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, and mesyl group.

Further, given as specific examples of the above-mentioned cyclic acid-decomposable groups are a cyclopropyl group, cyclopentyl group, cyclohexyl group, cyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, and 3-tetrahydrothiophene-1,1-dioxide group.

Among these acid-decomposable groups mentioned, the t-butyl group, benzyl group, 1-methoxyethyl group, 1-ethoxyethyl group, trimethylsilyl group, t-butoxycarbonylmethyl group, tetrahydropyranyl group, tetrahydrofuranyl group, tetrahydrothiopyranyl group, tetrahydrothiofuranyl group, and the like are preferred.

The inclusion rate of an acid-decomposable group in an acid-decomposable group-containing resin (i.e. the ratio of the number of acid-decomposable groups to the combined number of acidic functional groups and acid-decomposable groups contained in an acid-decomposable group-containing resin) can be varied depending upon the type of acid-decomposable groups or the alkali-soluble resin in which said group is included, and hence cannot be generically defined; however, it is preferably between 10 and 100%, and more preferably, between 15 and 100%.

The polystyrene-reduced weight average molecular weight (hereafter referred to as "Mw"), as determined by gel permeation chromatography, is preferably between 1,000 and 150,000, and more preferably, between 3,000 and 100,000.

An acid-decomposable group-containing resin can be prepared, for example, by introducing one or more acid-decomposable groups into an alkali-soluble resin that has been prepared beforehand, or by (co)polymerization of one or more monomers containing acid-decomposable groups, or by (co)polycondensation of one or more polycondensation components containing acid-decomposable groups.

Particularly preferred as the acid-decomposable group-containing resin for the positive tone resin composition is a resin prepared by replacing a portion of the hydrogen atoms belonging to the hydroxyl group in poly(hydroxystyrene) with the aforementioned acid-decomposable groups, and also a resin prepared by replacing a portion or all of hydrogen atoms belonging to the hydroxyl group and/or carboxyl group in a copolymerization product of hydroxystyrene and/or hydroxy-α-methylstyrene and (meth)acrylic acid with the aforementioned acid-decomposable groups.

An acid-decomposable group-containing resin also has a characteristic of controlling the alkali solubility of an alkali-soluble resin. It functions by decomposing in the presence of an acid to lower or lose its effectiveness in suppressing the alkali solubility, or to otherwise facilitate the alkali solubility of said alkali-soluble resin, and therefore falls in the category of the component (A) (b) in the positive tone resin composition.

In the positive tone resin composition, as a particularly preferred acid-decomposable group-containing resin, for example, a random copolymer or a block copolymer represented by the following formulae (1) or (2) can be mentioned:

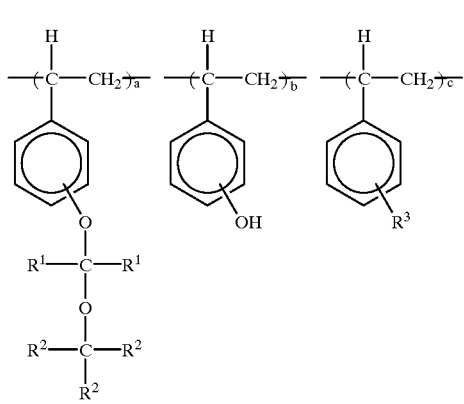

(1)

wherein $R^1$ and $R^2$ may be identical or different, or a plural $R^1$ or a plural $R^2$ may also be identical or different when there exists more than one $R^1$ and $R^2$, and indicate a hydrogen atom, methyl group, or ethyl group; $R^3$ indicates a hydrogen atom, t-butoxy group, t-butoxycarbonyl group, or t-butoxycarbonylmethyl group; a, b, and c are integers representing the numbers of each corresponding recurring unit and equal to or larger than 1, 1, and 0, respectively,

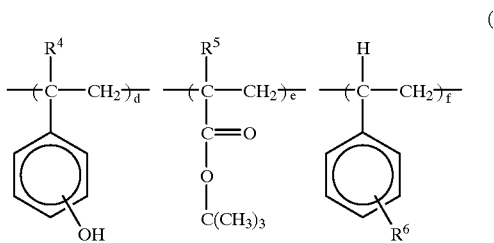

(2)

wherein $R^4$ and $R^5$ indicate a hydrogen atom or methyl group, independently; $R^6$ indicates a hydrogen atom, t-butoxy group, or —O—$C(R^7)_2$—O—$C(R^8)_3$ in which $R^7$ and $R^8$ may be identical or different, or when there exist more than one $R^7$ and $R^8$ a plural $R^7$ or a plural $R^8$ may also be identical or different, and indicate a hydrogen atom, methyl group, or ethyl group; d, e, and f are integers representing the numbers of each corresponding recurring unit and equal to or larger than 1, 1, and 0, respectively.

In the positive tone resin composition, the acid-decomposable group-containing resin may be used either singly or in an admixture of two or more compounds.

Alkali-soluble Resin

The alkali-soluble resin used in the positive tone resin composition (as the component (A) (b)) and the negative tone resin composition (as the component (C)) is a resin containing functional groups including, for example, one or more types of acidic functional groups such as a phenolic hydroxyl group or a carboxyl group, that exhibit affinity to and hence, render the resin soluble in an alkaline developing solution.

As such an alkali-soluble resin, for example, an addition-polymerized type resin having one or more recurring units represented by the following formulae (3) to (5), and a polycondensated type resin having one or more recurring units represented by the following formula (6) can be mentioned:

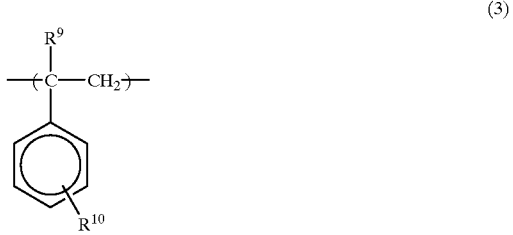

(3)

wherein $R^9$ indicates a hydrogen atom or methyl group; $R^{10}$ is either —OH, —COOH, —$R^{11}$COOH, —$OR^{11}$COOH, or —$OCOR^{11}$COOH, in which $R^{11}$ indicates —(CH)g—, with g representing an integer from 1 to 4,

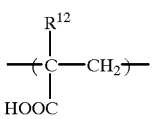

(4)

wherein $R^{12}$ indicates a hydrogen atom or methyl group,

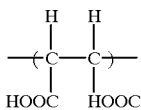
(5)

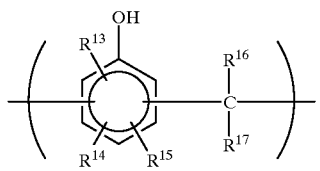
(6)

wherein $R^{13}$, $R^{14}$, $R^{15}$, $R^{16}$ and $R^{17}$ may be identical or different, and indicate either a hydrogen atom or an alkyl group having 1 to 4 carbon atoms.

In the event that the alkali-soluble resin is an addition-polymerized type resin, it may either comprise only the recurring units as represented by the above-mentioned formulae (3) through (5), or may additionally contain other recurring units as long as the resulting resin is soluble in an alkaline developing solution.

As the above-mentioned other recurring units, there can be mentioned, for example, units resulting from cleavage of a polymerizable double bond contained in monomers such as styrene, α-methylstyrene, maleic acid anhydride, (meth) acrylonitrile, crotonitrile, maleinnitrile, fumaronitrile, mesaconitrile, citraconitrile, itaconitrile, (meth)acrylamide, crotonamide, maleinamide, fumaramide, mesaconamide, citraconamide, itaconamide, vinylaniline, vinylpyridine, vinyl-ε-caprolactam, vinylpyrrolidone, and vinylimidazole.

The above-mentioned addition-polymerized resin can be prepared, for example, by (co)polymerizing one or more types of monomers corresponding to recurring units as represented by the formulae (3) through (5) with a monomer corresponding to the other recurring unit mentioned above.

The (co)polymerization reaction described above can be performed by an appropriate method such as block polymerization, solution polymerization, precipitation polymerization, emulsion polymerization, suspension polymerization, or block-suspension polymerization, using a suitable polymerization initiator or polymerization catalyst such as a radical polymerization initiator, anionic polymerization catalyst, coordinated anionic polymerization catalyst, and cationic polymerization catalyst.

In the event that the alkali-soluble resin is a polycondensated type resin, it may either comprise only recurring units as represented by the above-mentioned formula (6), or may additionally contain other recurring units as long as the resulting resin is soluble in an alkaline developing solution.

Such a polycondensated resin can be prepared by (co) polycondensating one or more types of phenols corresponding to recurring units as represented by the formula (6) and one or more types of aldehydes, and optionally with another polycondensation component that can constitute another recurring unit as the case may be, in the presence of an acidic catalyst and within a water medium or a mixed medium of water and a hydrophilic solvent.

Given as specific examples of the above-mentioned phenols and aldehydes are o-cresol, p-cresol, 2,3-xylenol, 2,4-xylenol, 2,5-xylenol, 3,4-xylenol, 3,5-xylenol, 2,3,5-trimethylphenol, and 3,4,5-trimethylphenol; and formaldehyde, trioxane, paraformaldehyde, benzaldehyde, acetoaldehyde, propylaldehyde, and phenylacetoaldehyde, respectively.

The content of recurring units as represented by formulae (3) through (6) in the alkali-soluble resin can be varied depending upon the types of said other recurring units optionally contained and hence cannot be uniquely defined; however, it is preferably 10 to 100 mole %, and more preferably 20 to 100 mole %.

While the Mw of an alkali-soluble resin can be varied depending upon desired characteristics of the radiation sensitive resin composition of interest, it is preferably 1,000 to 150,000, and more preferably 3,000 to 100,000.

When an alkali-soluble resin has a recurring unit that contains carbon-carbon unsaturations, such as represented by formulae (3), (6), and the like, it can also be used as a hydrogenated compound. In such a case, the rate of hydrogenation is usually 70% or less, preferably 50% or less, and more preferably, 40% or less of the carbon-carbon unsaturations contained in the recurring unit such as those represented by formulae (3), (6), and the like. If the above hydrogenation rate exceeds 70%, the developability of the alkali-soluble resin with an alkaline developing solution may become degraded.

As the alkali-soluble resin for the positive tone resin composition and the negative tone resin composition, resins mainly comprising poly(hydroxystyrene), a copolymer of hydroxystyrene and hydroxy-α-methylstyrene, as well as a copolymer of hydroxystyrene and styrene are particularly preferred.

In the positive tone resin composition and the negative tone resin composition the alkali-soluble resin may be used either singly or in an admixture of two or more compounds.

Alkali Dissolution Controller

As the alkali dissolution controller used in the positive tone resin composition (as the component (A)(b)), for example, compounds in which the acidic functional groups such as phenolic hydroxyl group, carboxyl group, and the like have been replaced by at least one type of acid decomposable group which is decomposed in the presence of an acid (hereinafter referred to as the "acid-decomposable substituent") can be mentioned.

Examples of such an acid-decomposable substituent include, for example, groups mentioned earlier as the acid-decomposable groups in an acid-decomposable group-containing resin, namely, substituted methyl groups, 1-substituted ethyl groups, silyl groups, 1-branched alkyl groups, germyl groups, alkoxycarbonyl groups, acyl groups, and cyclic acid-decomposable groups.

The alkaline dissolution controller may be either a low molecular weight compound or a high molecular weight compound. Specific examples of such a low molecular weight compound include compounds as represented by the following formulae (7) through (11):

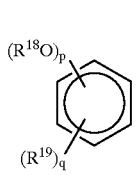
(7)

wherein $R^{18}$ indicates an acid-decomposable group comprising substituted methyl group, 1-substituted ethyl group, 1-branched alkyl group, silyl group, germyl group, alkoxycarbonyl group, acyl group, or cyclic acid-decomposable group, which may be identical or different when there exists more than one $R^{18}$; $R^{19}$ indicates an alkyl group having 1 to 4 carbon atoms, a phenyl group, or 1-naphthyl group, which may be identical or different when there exists more than one $R^{19}$; and p and q are integers equal to or larger than 1 and 0, respectively, and satisfying the relationship, p+q≦6,

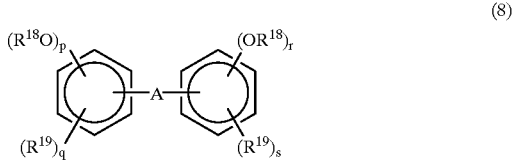

(8)

wherein $R^{18}$ and $R^{19}$ have the same meaning as in the formula (7), and A indicates a single bond, —S—, —O—, —CO—, —COO—, —SO—, —SO2—, or —C($R^{20}$)($R^{21}$)—, wherein $R^{20}$ and $R^{21}$ may be identical or different and indicate a hydrogen atom, an alkyl group having 1 to 4 carbon atoms, an acyl group having 2 to 11 carbon atoms, phenyl group, phenacyl group, or a group represented by

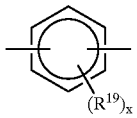

wherein $R^{19}$ is the same as above, and x is an integer between 0 and 4; and p, q, r, and s are integers each equal to or larger than 0, satisfying the relationships, p+q≦5, r+s≦5, and p+r≧1,

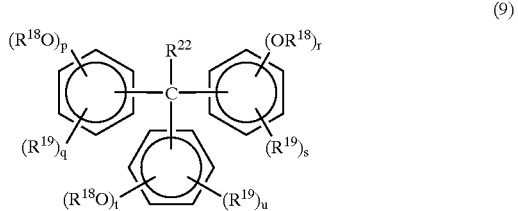

(9)

wherein $R^{18}$ and $R^{19}$ have the same meaning as in the formula (7), $R^{22}$ indicates a hydrogen atom, an alkyl group having 1 to 4 carbon atoms, or a phenyl group; and p, q, r, s, t, and u are integers each equal to or larger than 0, satisfying the relationships, p+q≦5, r+s≦5, t+u≦5, and p+r+t≧1,

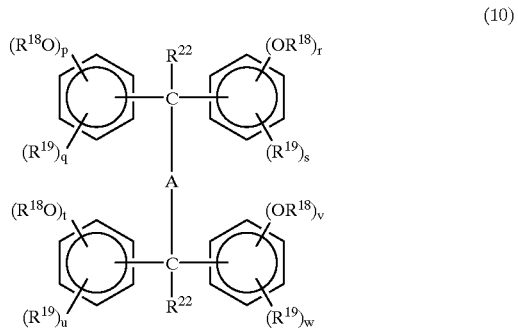

(10)

wherein $R^{18}$ and $R^{19}$ have the same meaning as in the formula (7), A as in the formula (8), and $R^{22}$ as in the formula (9), which may be identical or different when there exists more than one $R^{22}$; and p, q, r, s, t, u, v, and w are integers each equal to or larger than 0, satisfying the relationships, p+q≦5, r+s≦5, t+u≦5, v+w≦5, and p+r+t+v≧1,

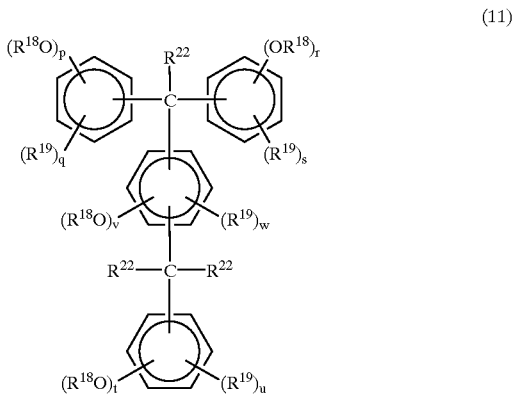

(11)

wherein $R^{18}$ and $R^{19}$ have the same meaning as in the formula (7), and $R^{22}$ as in the formula (9), which may be identical or different when there exists more than one $R^{22}$; and p, q, r, s, t, u, v, and w are integers each equal to or larger than 0, satisfying the relationships, p+q≦5, r+s≦5, t+u≦5, v+w≦4, and p+r+t+v≧1.

The aforementioned acid-decomposable group-containing resin may be used as the high molecular weight alkali dissolution controller, for example.

In the positive tone resin composition, each of the low molecular weight alkali dissolution controller compounds as well as the high molecular weight alkali dissolution controller compounds (i.e. acid-decomposable group-containing resins) may be used either singly or in an admixture of two or more compounds in the same grouping, or in combinations of high and low molecular weight compounds.

Cross-linking Agent

The cross-linking agent used in the negative tone resin composition (as the component (D)) is a compound capable of cross-linking an alkali-soluble resin in the presence of an acid, such as that generated by an exposure. As such a cross-linking agent, for example, compounds which have one or more types of substituents (hereinafter referred to as the "cross-linking substituents") exhibiting a cross-linking reactivity with an alkali-soluble resin can be mentioned.

As the cross-linking substituents in a cross-linking agent, for example, groups as represented by the following formulae (12) through (16) can be mentioned:

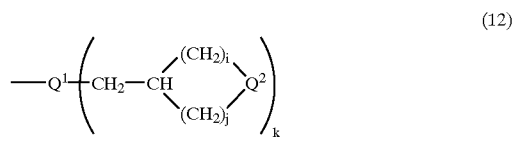

(12)

wherein k is either 1 or 2; $Q^1$ indicates either a single bond, —O—, —S—, —COO— or —NH— when k=1, or a trivalent nitrogen atom when k=2; $Q^2$ indicates —O— or —S—; and i and j are integers with values ranging from 0 to 3, and from 1 to 3, respectively, provided that i+j=1 to 4.

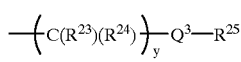
(13)

wherein $Q^3$ indicates —O—, —COO—, or —CO—; $R^{23}$ and $R^{24}$ may be identical or different and indicate either a hydrogen atom or an alkyl group with 1 to 4 carbon atoms; $R^{25}$ indicates an alkyl group with 1 to 5 carbon atoms, an aryl group with 6 to 12 carbon atoms, or an aralkyl group with 7 to 14 carbon atoms; and y is an integer of 1 or more,

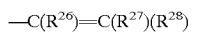
(14)

wherein $R^{26}$, and $R^{27}$, and $R^{28}$ may be identical or different and indicate either a hydrogen atom or an alkyl group with 1 to 4 carbon atoms,

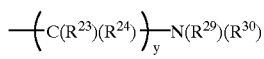
(15)

wherein $R^{23}$ and $R^{24}$ have the same meanings as in the formula (13); $R^{29}$ and $R^{30}$ may be identical or different, and indicate an alkylol group with 1 to 5 carbon atoms; and y is an integer of 1 or more.

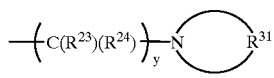
(16)

wherein $R^{23}$ and $R^{24}$ have the same meanings as in the formula (13); $R^{31}$ indicates a divalent organic group forming a cyclic structure of 3 to 8 members containing a hetero atom of either oxygen, sulfur, or nitrogen; and y is an integer of 1 or more.

Given as specific examples for such a cross-linking substituent are a glycidyl ether group, glycidyl ester group, glycidyl amino group, methoxymethyl group, ethoxymethyl group, benzyloxymethyl group, dimethylaminomethyl group, diethylaminomethyl group, dimethylolaminomethyl group, diethylolaminomethyl group, morpholinomethyl group, acetoxymethyl group, benzoyloxymethyl group, formyl group, acetyl group, vinyl group, and isopropenyl group.

Compounds that contain the above-mentioned cross-linking substituents include, for example, bisphenol-A type epoxy compound, bisphenol-F type epoxy compound, bisphenol-S type epoxy compound, novolak resin type epoxy compound, resol resin type epoxy compound, poly(hydroxystyrene) type epoxy compound, methylol group-containing melamine compound, methylol group-containing benzoguanamine compound, methylol group-containing urea compound, methylol group-containing phenol compound, alkoxyalkyl group-containing melamine compound, alkoxyalkyl group-containing benzoguanamine compound, alkoxyalkyl group-containing urea compound, alkoxyalkyl group-containing phenol compound, carboxymethyl group-containing melamine resin, carboxymethyl group-containing benzoguanamine resin, carboxymethyl group-containing urea resin, carboxymethyl group-containing phenol resin, carboxymethyl group-containing melamine compound, carboxymethyl group-containing benzoguanamine compound, carboxymethyl group-containing urea compound, and carboxymethyl group-containing phenol compound.

Preferred among these compounds containing cross-linking substituents are: methylol group-containing phenol compounds, methoxymethyl group-containing melamine compounds, methoxymethyl group-containing phenol compounds, methoxymethyl group-containing glycoluril compounds, methoxymethyl group-containing urea compounds, and acetoxymethyl group-containing phenol compounds. Even more preferred are compounds such as methoxymethyl group-containing melamine compounds (for example, hexamethoxymethyl melamine), methoxymethyl group-containing glycoluryl compounds, and methoxymethyl group-containing urea compounds. Methoxymethyl group-containing melamine compounds are commercially available under the trademarks of CYMEL300, CYMEL301, CYMEL303, and CYMEL305 (manufactured by Mitsui Cyanamid Co., Ltd.) and others; methoxymethyl group-containing glycoluril compounds under the trademark of CYMEL1174 (manufactured by Mitsui Cyanamid Co., Ltd.) and others; and methoxymethyl group-containing urea compounds under the trademark of MX290 (manufactured by Sanwa Chemical Co., Ltd.) and others.

Furthermore, as a cross-linking agent, such a compound as prepared by introducing the aforementioned cross-linking substituent into the acidic functional groups in an alkali-soluble resin to impart the characteristics of a cross-linking agent is also suitable. The inclusion rate of the cross-linking substituent can be varied depending upon the type of the cross-linking substituent or the alkali-soluble resin in which said substituent is included, and hence cannot be generically defined; however, it is usually between 5 and 60 mole %, preferably between 10 and 50 mole %, and more preferably, between 15 and 40 mole %, of the total quantity of acidic functional groups in the alkali-soluble resin. If the inclusion rate of the cross-linking substituent is less than 5 mole %, adverse effects are likely to occur in the areas of coating retention rate, or meandering or swelling of the patterns; if it is in excess of 60 mole %, the developability of the alkali-soluble resin may become degraded.

As the cross-linking agent in the negative tone resin composition, methoxymethyl group-containing compounds such as dimethoxymethyl urea, tetramethoxymethyl glycoluril and the like are particularly preferred.

In the negative tone resin composition the cross-linking agent may be used either singly or in an admixture of two or more compounds.

(B) Photoacid Generator

The photoacid generator used in the positive tone resin composition (as the component (B)) and in the negative tone resin composition (as the component (B)) comprises two or more chemical compounds, wherein at least one of the constituents comprises "a compound that upon exposure to radiation generates a carboxylic acid having a boiling point of 150° C. or higher under atmospheric pressure" (hereinafter called the "acid generator (B1)"), and also at least one of the constituents comprises "a compound that upon exposure to radiation generates an acid other than a carboxylic acid" (hereinafter called the "acid generator (B2)").

In the present invention, the problems of "nano-edge roughness" or "coating surface roughness" can be markedly suppressed by using the acid generator (B1) and acid generator (B2) as the photoacid generator.

As the carboxylic acid having a boiling point of 150° C. or higher under atmospheric pressure that is generated by the acid generator (B1) upon exposure to radiation, there can be mentioned, for example, saturated aliphatic carboxylic acids, unsaturated aliphatic carboxylic acids, halogen-containing aliphatic carboxylic acids, hydroxyl group-containing aliphatic carboxylic acids, alkoxyl group-containing aliphatic carboxylic acids, keto group-containing aliphatic carboxylic acids, aldehyde group-containing aliphatic carboxylic acids, alicyclic structure-containing aliphatic carboxylic acids, aromatic ring-containing conjugate carboxylic acids (i.e. carboxylic acids wherein the C=O group in the carboxylic group and the double bonds in the aromatic ring have a conjugating relationship), and aromatic ring-containing non-conjugate carboxylic acids.

In the positive tone resin composition and the negative tone resin composition, the combined use of such an acid generator (B1) generating a carboxylic acid having a boiling point of 150° C. or higher under atmospheric pressure and another acid generator (B2) that generates another acid enables the formation of resist patterns that are particularly excellent in pattern profile.

As the preferred acid generators (B1), for example, (a) onium salt compounds of carboxylic acids as represented by the following formulae (17) through (30) (hereinafter called "acid generator (B1-a)"), (b) carboxyimide compounds generated in a dehydration-condensation reaction between hydroxyimide structure-containing compounds and carboxylic acids as represented by the following formulae (17) through (30) (hereinafter called "acid generator (B1-b)"), and the like can be mentioned:

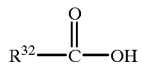
(17)

wherein $R^{32}$ indicates a linear, branched, or cyclic alkyl group having 1 to 20 carbon atoms; a linear, branched, or cyclic alkenyl group having 1 to 20 carbon atoms; a linear, branched, or cyclic alkinyl group having 1 to 20 carbon atoms; a linear, branched, or cyclic alkoxyl group; a group wherein at least a part of the hydrogen atoms in the above-mentioned alkyl group has been replaced with a halogen atom and/or hydroxyl group; a group wherein at least a part of the hydrogen atoms in the above-mentioned alkenyl group has been replaced with a halogen atom and/or hydroxyl group; or either a substituted or non-substituted aryl group consisting of 6 to 20 carbon atoms,

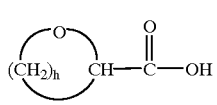
(18)

wherein h is an integer from 2 to 6,

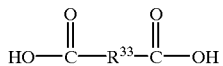
(19)

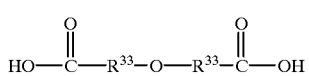
(20)

where, in the formulae (19) and (20), $R^{33}$ indicates a linear, branched, or cyclic alkylene group having 1 to 20 carbon atoms; a linear, branched, or cyclic alkenylene group having 1 to 20 carbon atoms; a group wherein at least a part of the hydrogen atoms in the above-mentioned alkylene group has been replaced with a halogen atom and/or hydroxyl group; a group wherein at least a part of the hydrogen atoms in the above-mentioned alkenylene group has been replaced with a halogen atom and/or hydroxyl group; or an alkoxyalkylene group having 2 to 20 carbon atoms; such groups may be identical or different when there exists more than one $R^{33}$,

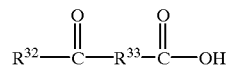
(21)

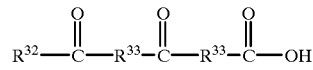
(22)

where, in the formulae (21) and (22), $R^{32}$ has the same meaning as in the formula (17); $R^{33}$ has the same meaning as in the formula (19) which may be identical or different when there exists more than one $R^{33}$,

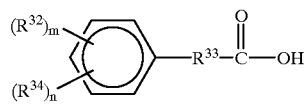
(23)

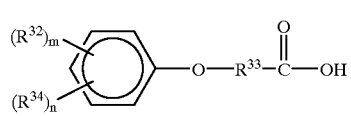
(24)

where, in the formulae (23) and (24), $R^{32}$, which has the same meaning as in the formula (17), may be identical or different when there exists more than one $R^{32}$; $R^{33}$ has the same meaning as in the formula (19); $R^{34}$, which indicates either a hydroxyl group or a halogen atom, may be identical or different when there exists more than one $R^{34}$; and m and n are integers from 0 to 3 satisfying the relationship, $m+n \leq 5$,

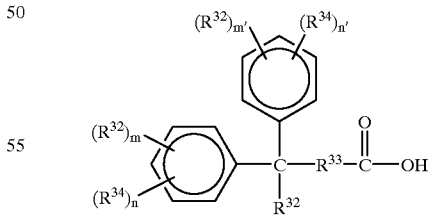
(25)

wherein $R^{32}$, which has the same meaning as in the formula (17), may be identical or different when there exists more than one $R^{32}$; $R^{33}$ has the same meaning as in the formula (19); $R^{34}$, which has the same meaning as in the formula (23), may be identical or different when there exists more than one $R^{34}$; and m, n, m', and n' are integers from 0 to 3 satisfying the relationships, $m+n \leq 5$ and $m'+n' \leq 5$,

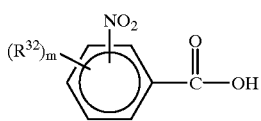
(26)

wherein $R^{32}$ has the same meaning as in the formula (17) and m is an integer from 0 to 3,

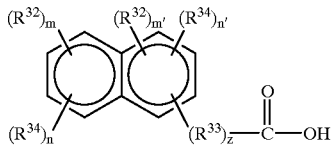
(27)

wherein $R^{32}$, which has the same meaning as in the formula (17) may be identical or different when there exists more than one $R^{32}$; $R^{33}$ has the same meaning as in the formula (19); $R^{34}$, which has the same meaning as in the formula (23), may be identical or different when there exists more than one $R^{34}$; m, n, m', and n' are integers from 0 to 3 satisfying the relationships, m+n≦4 and m'+n'≦3; and z is either 0 or 1,

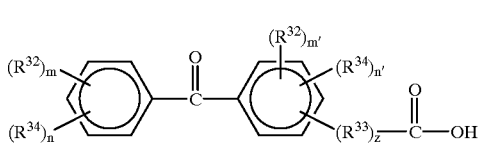
(28)

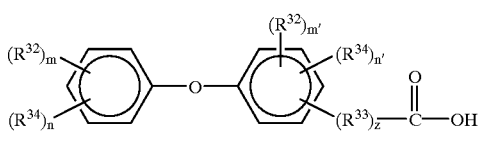
(29)

where, in the formulae (28) and (29), $R^{32}$ which has the same meaning as in the formula (17), may be identical or different when there exists more than one $R^{32}$; $R^{33}$ has the same meaning as in the formula (19); $R^{34}$, which has the same meaning as in the formula (23), may be identical or different when there exists more than one $R^{34}$; m, n, m', and n' are integers from 0 to 3 satisfying the relationships, m+n≦5 and m'+n'≦4; and z is either 0 or 1,

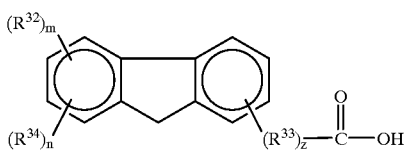
(30)

wherein $R^{32}$, which has the same meaning as in the formula (17), may be identical or different when there exists more than one $R^{32}$; $R^{33}$ has the same meaning as in the formula (19); $R^{34}$, which has the same meaning as in the formula (23), may be identical or different when there exists more than one $R^{34}$; m and n are integers from 0 to 3 satisfying the relationship, m+n≦4; and z is either 0 or 1.

As particularly preferred acid generators (B1-a), for example, iodonium salts such as bis (t-butylphenyl) iodonium salt or diphenyliodonium salt of carboxylic acids as represented by the above-mentioned formulae (17) through (30); sulfonium salts such as triphenylsulfonium salt or 4-t-butylphenyl-diphenylsulfonium salt of carboxylic acids as represented by said formulae (17) through (30), and the like can be mentioned.

Specific examples of such iodonium salts and sulfonium salts include compounds as represented by the following formulae (31) through (36):

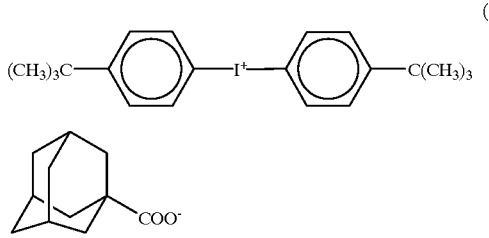
(31)

(32)

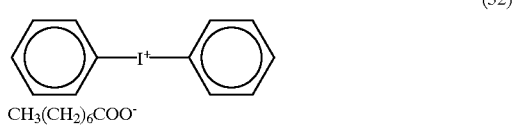
(33)

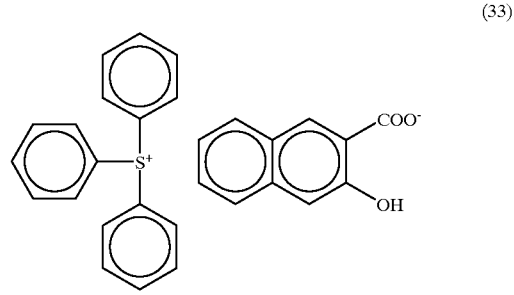
(34)

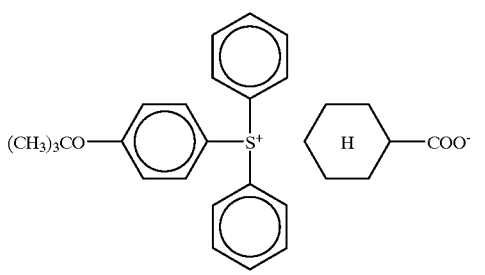
(35)

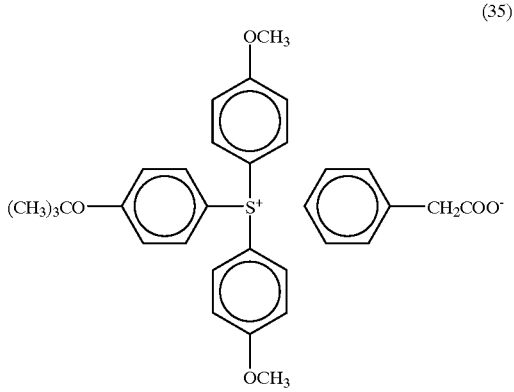

-continued

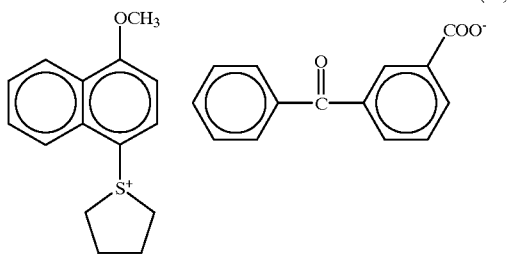
(36)

Furthermore, particularly preferred acid generators (B1-b), for example, are dehydration-condensation products generated between carboxylic acids as represented by the above-mentioned formulae (17) through (30) and compounds such as N-hydroxysuccinimide, N-hydroxyphthalimide, N-hydroxydiphenylmaleimide, N-hydroxybicyclo-[2.2.1]-hept-5-ene-2,3-dicarboxyimide, N-hydroxy-7-oxabicyclo-[2.2.1]-hept-5-ene-2,3-dicarboxyimide, N-hydroxybicyclo-[2.2.1]-heptane- 5,6-oxy-2,3-dicarboxyimide, N-hydroxynaphthylimide, and the like.

Specific examples of such dehydration-condensation products include compounds as represented by the following formulae (37) through (40):

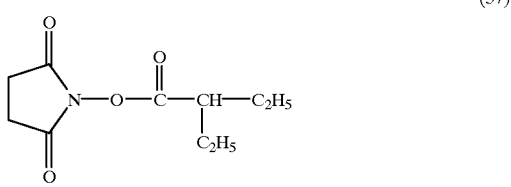
(37)

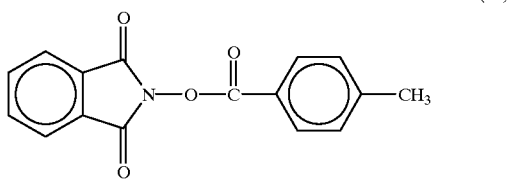
(38)

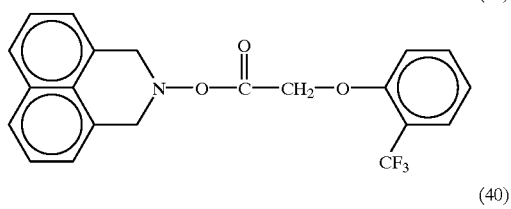
(39)

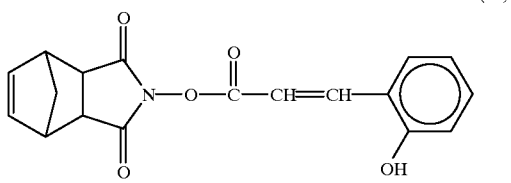
(40)

These acid generators (B1) may be used either singly or in an admixture of two or more compounds.

Next, as the acid generator (B2), compounds that upon exposure to radiation generate sulfonic acid and/or sulfinic acid are preferred.

Listed hereunder in five major groupings are examples of such compounds as described above:

① Onium Salt Compounds:

As onium salt compounds, for example, iodonium salts, sulfonium salts, phosphonium salts, diazonium salts, ammonium salts, or pyridinium salts can be mentioned.

Specific examples of onium salt compounds include bis (4-t-butylphenyl)iodonium perfluorobutanesulfonate, bis(4-t-butylphenyl)iodonium trifluoromethanesulfonate, bis(4-t-butylphenyl)iodonium pyrenesulfonate, bis(4-t-butylphenyl)iodonium dodecylbenzenesulfonate, bis(4-t-butylphenyl)iodonium p-toluenesulfonate, bis(4-t-butylphenyl)iodonium benzenesulfonate, bis(4-t-butylphenyl).iodonium 1-camphorsulfonate, bis(4-t-butylphenyl)iodonium octanesulfonate, bis(4-t-butylphenyl) iodonium 2-trifluoromethylbenzenesulfonate, diphenyliodonium perfluorobutanesulfonate, diphenyliodonium trifluoromethanesulfonate, diphenyliodonium pyrenesulfonate, diphenyliodonium dodecylbenzenesulfonate, diphenyliodonium p-toluenesulfonate, diphenyliodonium benzenesulfonate, diphenyliodonium 10-camphorsulfonate, diphenyliodonium octanesulfonate, diphenyliodonium 2-trifluoromethylbenzenesulfonate, triphenylsulfonium perfluorobutanesulfonate, triphenylsulfonium trifluoromethanesulfonate, triphenylsulfonium pyrenesulfonate, triphenylsulfonium dodecylbenzenesulfonate, triphenylsulfonium p-toluenesulfonate, triphenylsulfonium benzenesulfonate, triphenylsulfonium 10-camphorsulfonate, triphenylsulfonium octanesulfonate, triphenylsulfonium 2-trifluoromethylbenzenesulfonate, 4-t-butylphenyl-diphenylsulfonium perfluorobutanesulfonate, 4-t-butylphenyl-diphenylsulfonium trifluoromethanesulfonate, 4-t-butoxyphenyl-diphenylsulfonium pyrenesulfonate, 4-t-butoxyphenyl-diphenylsulfonium dodecylbenzenesulfonate, 4-t-butoxyphenyl-diphenylsulfonium p-toluenesulfonate, 4-t-butoxyphenyl-diphenylsulfonium benzenesulfonate, 4-t-butoxyphenyl-diphenylsulfonium 10-camphorsulfonate, and 4-t-butoxyphenyl-diphenylsulfonium octanesulfonate, can be mentioned.

② Sulfone Compounds:

As sulfone compounds, for example, β-ketosulfones, β-sulfonylsufones and their α-diazo compounds can be mentioned.

Specific examples of sulfone compounds include phenacylphenylsulfone, mesitylphenacylsulfone, bis (phenylsulfonyl)methane, 4-trisphenacylsulfone, and the like.

③ Sulfonate Compounds:

As sulfonate compounds, for example, alkyl sulfonates, haloalkyl sulfonates, aryl sulfonates, or haloaryl sulfonates can be mentioned.

Specific examples of sulfonate compounds include benzointosylate, pyrogallol tristrifluoromethane sulfonate, pyrogallol methanesulfonic acid triester, nitrobenzyl- 9,10-diethoxyanthrasene-2-sulfonate, α-methylolbenzoin tosylate, α-methylolbenzoin octanesulfonate, α-methylolbenzoin dodecylsulfonate, and the like.

④ Sulfonimide Compounds:

As sulfonimide compounds, for example, those which are represented by the formula (41) given below can be mentioned:

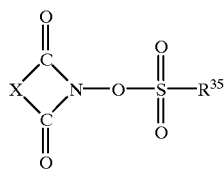

(41)

wherein X represents a divalent group such as an alkylene group, arylene group, or alkoxylene group, and $R^{35}$ represents a monovalent group such as an alkyl group, aryl group, halogenated alkyl group, or halogenated aryl group.

Specific examples of sulfonimide compounds include, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)-bicyclo-[2.2.1]-hept-5-ene-2,3-dicarboxyimide, N-(trifluoromethylsulfonyloxy)-7-oxabicyclo-[2.2.1]-hept-5-ene-2,3-dicarboxyimide, N-(trifluoromethylsulfonyloxy)-bicyclo-[2.2.1]-heptane-5,6-oxy-2,3-dicarboxyimide, N-(perfluorobutylsulfonyloxy) naphthylimide, N-(perfluorobutylsulfonyloxy)succinimide, N-(perfluorobutylsulfonyloxy)phthalimide, N-(perfluorobutylsulfonyloxy)diphenylmaleimide, N-(perfluorobutylsulfonyloxy)-bicyclo-[2.2.1]-hept-5-ene-2,3-dicarboxyimide, N-(perfluorobutylsulfonyloxy)-7-oxabicyclo-[2.2.1]-hepto-5-ene-2,3-dicarboxyimide, N-(perfluorobutylsulfonyloxy)-bicyclo-[2.2.1]-heptane-5,6-oxy-2,3-dicarboxyimide, N-(perfluorobutylsulfonyloxy) naphthylimide, N-(camphorsulfonyloxy)succinimide, N-(camphorsulfonyloxy)phthalimide, N-(camphorsulfonyloxy)diphenylmaleimide, N-(camphorsulfonyloxy)-bicyclo-[2.2.1]-hept-5-ene-2,3-dicarboxyimide, N-(camphorsulfonyloxy)-7-oxabicyclo-[2.2.1]-hept-5-ene-2,3-dicarboxyimide, N-(camphorsulfonyloxy)-bicyclo-[2.2.1]-heptane-5,6-oxy-2,3-dicarboxyimide, N-(camphorsulfonyloxy) naphthylimide, N-(4-methylphenylsulfonyloxy) succinimide, N-(4-methylphenylsulfonyloxy)phthalimide, N-(4-methylphenylsulfonyloxy)diphenylmaleimide, N-(4-methylphenylsulfonyloxy)-bicyclo-[2.2.1]-hept-5-ene-2,3-dicarboxyimide, N-(4-methylphenylsulfonyloxy)-7-oxabicyclo-[2.2.1]-hept-5-ene-2,3-dicarboxyimide, N-(4-methylphenylsulfonyloxy)-bicyclo-[2.2.1]-heptane-5,6-oxy-2,3-dicarboxyimide, N-(4-methylphenylsulfonyloxy) naphthylimide, N-(2-trifluoromethylphenylsulfonyloxy) succinimide, N-(2-trifluoromethylphenylsulfonyloxy) phthalimide, N-(2-trifluoromethylphenylsulfonyloxy) diphenylmaleimide, N-(2-trifluoromethylphenylsulfonyloxy)-bicyclo-[2.2.1]-hept-5-ene-2,3-dicarboxyimide, N-(2-trifluoromethylphenylsulfonyloxy)-7-oxabicyclo-[2.2.1]-hept-5-ene-2,3-dicarboxyimide, N-(2-trifluoromethylphenylsulfonyloxy)-bicyclo-[2.2.1]-heptane-5,6-oxy-2,3-dicarboxyimide, N-(2-trifluoromethylphenylsulfonyloxy)naphthylimide, N-(4-fluorophenylsulfonyloxy)succinimide, N-(4-fluorophenylsulfonyloxy)phthalimide, N-(4-fluorophenylsulfonyloxy)diphenylmaleimide, N-(4-fluorophenylsulfonyloxy)-bicyclo-[2.2.1]-hept-5-ene-2,3-dicarboxyimide, N-(4-fluorophenylsulfonyloxy)-7-oxabicyclo-[2.2.1]-hept-5-ene-2,3-dicarboxyimide, N-(4-fluorophenylsulfonyloxy)-bicyclo-[2.2.1]-heptane-5,6-oxy-2,3-dicarboxyimide, N-(4-fluorophenylsulfonyloxy) naphthylimide, and the like.

⑤ Diazomethane Compounds:

As diazomethane compounds, for example, those which are represented by the formula (42) given below can be mentioned:

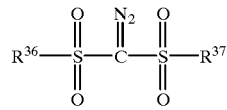

(42)

wherein $R^{36}$ and $R^{37}$ may be identical or different and indicate a monovalent group such as alkyl group, cycloalkyl group, aryl group, halogenated alkyl group, or halogenated aryl group.

Specific examples of diazomethane compounds include bis(trifluoromethylsulfonyl)diazomethane, bis (cyclohexylsulfonyl)diazomethane, bis(phenylsulfonyl) diazomethane, bis(p-toluenesulfonyl)diazomethane, methylsulfonyl-p-toluenesulfonyldiazomethane, 1-cyclohexylsulfonyl-1-(1,1-dimethylethylsulfonyl) diazomethane, bis(1,1-dimethylethylsulfonyl) diazomethane, and the like.

Furthermore, particularly preferred acid generators (B2), for example, are bis(4-t-butylphenyl)iodonium perfluorobutanesulfonate, bis(4-t-butylphenyl)iodonium trifluoromethanesulfonate, bis(4-t-butylphenyl)iodonium p-toluenesulfonate, bis(4-t-butylphenyl)iodonium 10-camphorsulfonate, triphenylsulfonium perfluorobutanesulfonate, triphenylsulfonium trifluoromethanesulfonate, triphenylsulfonium p-toluenesulfonate, triphenylsulfonium 10-camphorsulfonate, 4-t-butoxyphenyl-diphenylsulfonium p-toluenesulfonate, N-(2-trifluoromethylphenylsulfonyloxy)-bicyclo-[2.2.1]-hept-5-ene-2,3-dicarboxyimide, bis (cyclohexylsulfonyl) diazomethane, and the like.

The above-mentioned acid generators (B2) may be used either singly or in an admixture of two or more compounds.

In the positive tone resin composition and the negative tone resin composition, the quantitative ratio of acid generator (B1) to acid generator (B2) used in a resin composition, or a (B1/B2) ratio by weight, is usually 0.01 to 5, and preferably 0.02 to 2. The total quantity of acid generator (B1) and acid generator (B2) used for 100 parts by weight of the resin portion in the radiation sensitive resin composition of each respective invention, is usually 0.5 to 20 parts by weight, and preferably 1 to 15 parts by weight. If the quantitative ratio of acid generator (B1) to acid generator (B2) used in a resin composition, or the (B1/B2) ratio by weight, is less than 0.01, the resin applied as a resist has a tendency to provide a lesser degree of alleviation for the problems of "nano-edge roughness" or "coating surface roughness". On the other hand, if the above ratio exceeds 5 the resin when used as a resist will have reduced sensitivity which could obstruct the desired pattern forming. If the total quantity of acid generator (B1) and acid generator (B2) used is less than 0.5 part by weight, the catalytic effects of acid generated by an exposure may be insufficient to cause the desired amount of chemical reaction; if the quantity is more than 20 parts by weight, coating with the radiation sensitive resin composition may become uneven or a "scum" and other undesirable conditions may result in at the time of development.

Acid Diffusion Controller

In the positive tone resin composition and the negative tone resin composition, it is further feasible to use an acid diffusion controller to restrain the acid that is generated from the exposed photoacid generator (B) from diffusing inside the resist coating, thereby hindering undesirable chemical reactions occurring in the unexposed area of the resist. Use of such an acid diffusion controller improves pattern profile by suppressing the development of a visor-like hangover particularly at the top portion of the pattern, as well as dimensional fidelity in meeting the critical design dimension.

Nitrogen-containing compounds are preferred as an acid diffusion controller, since such compounds do not change basicity with exposure or heating treatment received during the resist pattern formation process.

Specific examples of such a nitrogen-containing compound include ammonia, trimethylamine, triethylamine, tri-n-propylamine, tri-n-butylamine, tri-n-pentylamine, tri-n-hexylamine, tri-n-heptylamine, tri-n-octylamine, aniline, N-methylaniline, N,N'-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pirrolidone, piperidine, imidazole, 4-methylimidazole, 4-methyl-2-phenylimidazole, benzimidazole, thiabendazole, pyridine, 2-methylpyridine, 4-ethylpyridine, 2-phenylpyridine, 4-phenylpyridine, 1-methyl-4-phenylpyridine, 2-(1-ethylpropyl)pyridine, 2-benzylpyridine, dibenzoylthiamine, riboflavin tetrabutyrate, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis [1-(4-aminophenyl)-1-methylethyl]benzene, 1,3-bis [1-(4-aminophenyl)-1-methylethyl]benzene, and the like.

Particularly preferred among the above-mentioned acid diffusion controllers are tri-n-butylamine, tri-n-pentylamine, tri-n-hexylamine, tri-n-heptylamine, tri-n-octylamine, N,N-dimethylaniline, benzimidazole, 4-phenylpyridine, 4,4'-diaminodiphenyl ether, nicotinic acid amide, and the like.

The acid diffusion controller may be used either singly or in an admixture of two or more compounds.

While the amount of acid diffusion controller to be used varies depending on the type and the combination with the acid generator (B1) and/or acid generator (B2), it is usually 10 parts by weight or less, and preferably 5 parts by weight or less, in proportion to 100 parts by weight of the resin portion in the radiation sensitive resin composition of each respective invention. If the quantity of the acid diffusion controller used exceeds 10 parts by weight, resist sensitivity or the exposed area developability tend to be degraded.

Surfactant

Further, in the positive tone resin composition and the negative tone resin composition, surfactants may be compounded to improve coatability, striation control, or the radiation sensitive resin composition developability.

As such a surfactant, any anionic, cationic, nonionic, or ampholitic type surfactant can be used, while the nonionic type is preferred among those mentioned. Specific examples of nonionic surfactants include, in addition to those generically known as polyoxyethylene—higher alkyl ethers, polyoxyethylene—higher alkylphenyl ethers, and polyethylene glycol—higher fatty acid diesters, the product series commercially known under the trademarks of KP (manufactured by Shin-Etsu Chemical Co., Ltd.), Polyflow (manufactured by Kyoeisha Chemical Co., Ltd.), EF Top (manufacturedbyTohkem Product Co., Ltd.), Megafac (manufactured by Dainippon Ink & Chemicals, Inc.), Fluorad (manufactured by Sumitomo 3M Ltd.), Asahiguard and SURFLON (manufactured by Asahi Glass Co., Ltd.), and the like.

These surfactants may be used either singly or in an admixture of two or more compounds.

The amount of surfactants to be added, in terms of active ingredient, is usually up to 2 parts by weight for 100 parts by weight of the total resin portion in the radiation sensitive resin composition.

Photosensitizer

Furthermore, in the positive tone resin composition and the negative tone resin composition, a photosensitizer may be additionally compounded. Such a photosensitizer functions to absorb the radiation energy and then transmit such energy to the photoacid generator (B), thereby increasing the amount of acid generated by exposure, which in turn improves the apparent sensitivity of a radiation sensitive resin composition.

Examples of preferred photosensitizers include acetophenones, benzophenones, naphthalenes, biacetyl, eosine, Rose Bengale, pyrenes, anthracenes, phenothiazines, and the like.

The amount of photosensitizers used is usually up to 50 parts by weight and preferably up to 30 parts by weight for 100 parts by weight of the total resin portion in the radiation sensitive resin composition Additionally, the inclusion of dyes or pigments enables visualization of latent images in the exposed area so that the influence of halation at the time of exposure is minimized. Use of an adhesive aid helps further improve adhesion with substrates.

Other additives such as halation preventives, storage stability improvers, anti-foam agents, shape modifiers or, specifically, compounds such as 4-hydroxy-4'-methylchalcone may be included as well.

Solvents

At the time of application, the positive tone resin composition and the negative tone resin composition are prepared as a composition solution by homogeneously dissolving the com position into a solvent so that the total solids in the preparation are 5 to 50% by weight, and then passing it through a filter having, for example, a pore diameter of 0.2 μm.

As the above-mentioned solvents, for example, ethers, esters, ether-esters, ketones, ketone-esters, amides, amidoesters, lactams, lactones, (halogenated) hydrocarbons and, more specifically, ethylene glycol monoalkyl ethers, diethylene glycol dialkyl ethers, propylene glycol monoalkyl ethers, propylene glycol dialkyl ethers, acetic acid esters, hydroxy acetic acid esters, lactic acid esters, ethylene glycol monoalkyl ether acetates, propylene glycol monoalkyl ether acetates, alkoxyacetic acid esters, (non) cyclic ketones, acetoacetic acid esters, piruvic acid esters, propionic acid esters, N,N-dialkyl formamides, N,N-dialkyl acetoamides, N-alkyl pyrrolidones, γ-lactones, (halogenated) aliphatic hydrocarbons, (halogenated) aromatic hydrocarbons, and the like can be mentioned.

Specific examples of such a solvent include ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, methyl cellosolve acetate, ethyl cellosolve acetate, propylene glycol monomethyl ether acetate, propylene glycol monoethyl ether acetate, propylene glycol monopropyl ether acetate, isopropenyl acetate, isopropenyl propionate, toluene, xylene, methyl ethyl ketone, cyclohexanone, 2-heptanone, 3-heptanone, 4-heptanone, ethyl 2-hydroxypropionate, ethyl 2-hydroxy-2-methylpropionate, ethyl ethoxyacetate, ethyl hydoxyacetate, methyl 2-hydroxy-3-methyl butyrate, 3-methoxybutyl acetate, 3-methyl-3-methoxybutyl acetate, 3-methyl-3-methoxybutyl propionate, 3-methyl-3-methoxybutyl butyrate, ethyl acetate, propyl acetate, butyl acetate, methyl acetoacetate, ethyl acetoacetate, methyl 3-methoxypropionate, ethyl 3-methoxypropionate, methyl 3-ethoxypropionate, ethyl 3-ethoxypropionate, N-methylpyrrolidone, N,N-dimethylformamide, N,N-dimethyl acetoamide, and the like.

Among the solvents mentioned above, 2-hydroxypropionic acid esters, 3-alkoxypropionic acid esters, propylene glycol monoalkyl ether acetates, and the like are preferred.

The above-mentioned solvents may be used either singly or in an admixture of two or more types.

Additionally, one or more types of high-boiling solvent such as benzyl ethyl ether, dihexyl ether, diethylene glycol monomethyl ether, diethylene glycol monoethyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, ethylene glycol monophenyl ether acetate and the like may be optionally added to the above-mentioned solvent.

Resist Pattern Formation:

To form a resist pattern using the positive tone resin composition and the negative tone resin composition, the composition solution prepared as described in the above is applied to a substrate, for example, of a silicon wafer or an aluminum coated wafer, with an appropriate method such as spin coating, cast coating, or roll coating to form a resist coating. The resist coating is heat-treated in advance (the process is hereinafter called "PB"), and then the said coating is exposed to radiation through a desired mask pattern. Radiation that can be used for the exposure is preferably far ultraviolet rays such as a bright-line spectrum of mercury-vapor light (wavelength: 254 nm), an ArF excimer laser beam (193 nm) or a KrF excimer laser beam (248 nm), X-rays such as synchrotron radiation or charged particle rays such as an electron beam may also be used, in accordance with the type of acid generator (B1) and/or acid generator (B2) used. Process conditions such as the exposure dosage are also selected as appropriate based on the formulation of the radiation sensitive resin composition and types of additives used.

In the present invention, it is preferred to perform a heat-treatment after exposure, or post exposure bake (hereafter called "PEB") to improve the apparent sensitivity of the resist film. Although the temperature for the heat treatment varies depending on the formulation of the radiation sensitive resin composition and types of additives used, it is usually 30 to 200° C., and preferably 50 to 150° C.

The exposed resist film is then developed using an alkaline developing solution to obtain the desired resist pattern.

For such an alkaline developing solution mentioned above, for example, an aqueous alkaline solution is prepared and used with at least one type of alkaline compound such as alkali metal hydroxides, aqueous ammonia, alkyl amines, alkanol amines, heterocyclic amines, tetraalkyl ammonium hydroxides, choline, 1,8-diazabicyclo[5.4.0]-7-undecene, or 1,5-diazabicyclo-[4.3.0]-5-nonene, so that the solution usually contains 1 to 10% by weight or preferably 1 to 5% by weight of these substances. Among the above-mentioned, tetraalkyl ammonium hydroxides are particularly preferred.

The aforementioned developing solution comprising an aqueous alkaline solution may also be supplemented with an appropriate amount of water-soluble organic solvent such as methanol and ethanol, and also an appropriate amount of surfactants.

As a general practice, when a developing solution comprising an aqueous alkaline solution is used, the resulting resist pattern is washed with waterafter the development process.

Other features of the invention will become apparent in the course of the following description of the exemplary embodiments which are given for illustration of the invention and are not intended to be limiting thereof.

EXAMPLES

Unless otherwise specified, all proportions are according to weight.

In the examples and comparative examples presented hereafter, measurement of Mw and Mw/Mn as well as evaluation of each resist are performed under procedures given below.

Resolution:

First, a resist coating built ona silicone wafer is exposed to different dosages of radiation, which is immediately followed by PEB, alkaline development, washing with water, and drying to form test resist patterns.

The resolution of a line-and-space pattern (1L1S) is defined as the smallest dimension (in µm) of the resist pattern that can be resolved at an optimum exposure, which is the amount of radiation energy that can project a line-and-space pattern (1L1S) into a 1 to 1 width ratio at the design line width of 0.26 µm.

Pattern Profile:

Of a line-and-space pattern (1L1S) formed on a silicon wafer with a line width of 0.26 µm, the lower end dimension La and the upper end dimension Lb of the square cross section of the pattern are measured using a scanning type electron microscope. When the measurement satisfies $0.85 \leq Lb/La \leq 1$, and at the same time, there is no "gouging" near the pattern bottom nor "visor" near the top, the pattern profile is determined to be "satisfactory"; otherwise the pattern profile is judged "unsatisfactory".

Coating Surface Roughness:

Of a line-and-space pattern (1L1S) formed on a silicon wafer with a line width of 0.26 µm, sectional side dimensions of the line pattern are measured using a scanning type electron microscope. When the smallest measurement of said line pattern, as illustrated in FIG. 1, is defined as Lin, the largest as Lout, and (Lout−Lin) as ΔL, the coating surface roughness is judged as follows based on the ΔL: (Note here that the jaggedness in FIG. 1 is shown exaggerated.)

ΔL is less than 0.01 µm: Good

ΔL is equal to or more than 0.01 µm: Poor

The following components were used in examples and comparative examples presented herein:

[I] Positive Tone Resin Composition

Acid-decomposable group-containing resin

A-1: A poly(hydroxystyrene)-based resin wherein 32 mol % of the hydrogen atoms in the phenolic hydroxyl group has been replaced with a 1-ethoxyethyl group (Mw=15,000)

A-2: A poly(hydroxystyrene)-based resin wherein 20 mol % of the hydrogen atoms in the phenolic hydroxyl group has been replaced with a t-butoxycarbonylmethyl group (Mw=25,000)

A-3: A poly(hydroxystyrene)-based resin wherein 25 mol % of the hydrogen atoms in the phenolic hydroxyl group has been replaced with a 1-ethoxyethyl group, and also 8 mol % of said hydrogen atoms has been replaced with a t-butoxycarbonyl group (Mw=16,000)

A-4: A copolymer product of p-hydroxystyrene and t-butyl acrylate (Copolymerization mol ratio=5:5, Mw=12,000)

A-5: A copolymer product of p-hydroxy-o-methylstyrene, t-butyl acrylate, and styrene (Copolymerization mol ratio=6:2:2, Mw=13,000)

Alkali-soluble resin

A-6: Poly(p-hydroxystyrene), (Mw=7,500)

Alkali dissolution controller

α-1: Bisphenol-A modified with bis(t-butoxycarbonyl)

Acid generator (B1)

B1-1: Per formula (31)
B1-2: Per formula (32)
B1-3: Per formula (33)
B1-4: Per formula (34)
B1-5: Per formula (35)
B1-6: Per formula (36)
B1-7: Per formula (37)
B1-8: Per formula (38)
B1-9: Per formula (39)
B1-10: Per formula (40)

Acid generator (82)

B2-1: Triphenylsulfonium trifluoromethanesulfonate

B2-2: Bis(4-t-butylphenyl)iodonium perfluorobutane-sulfonate

B2-3: Bis(4-t-butylphenyl)iodonium 10-camphorsulfonate

B2-4: N-(4-methylphenylsulfonyloxy)naphthylimide

B2-5: N-(2-trifluoromethylphenylsulfonyloxy)-bicyclo-[2.2.1]-hept-5-ene-2,3-dicarboxyimide B2-6: Bis(cyclohexylsulfonyl)diazomethane Other components As the acid diffusion controller, tri-n-hexylamine (denoted as β-1) or benzimidazole (β-2) was used. As the solvent, ethyl 2-hydroxypropionate (denoted as γ-1), propylene glycol monomethylether acetate (γ-2), or ethyl 3-ethoxypropionate (γ-3) was used.

[II] Negative Tone Resin Composition

Acid generator (B1) and acid generator (B2)

The same compounds used for [I] positive tone resin composition were used.

Alkali-soluble resin

C-1: Poly(p-hydroxystyrene), (Mw=7,500)

C-2: A copolymer product of p-hydroxystyrene and styrene (copolymerization mol ratio=7:3, Mw=7,000)

Cross-linking agent

D-1: Dimethoxymethylurea (under the trademark of MX290 manufactured by Sanwa Chemical Co. Ltd.)

D-2: Tetramethoxymethyloluril (under the trademark of CYMEL1174 manufactured by Mitsui Cyanamid Co., Ltd.)

Other components

The same acid diffusion controllers and solvents used for [I] positive tone resin composition were used.

Examples 1–18 and Comparative Examples 1–4

Composition solutions were prepared by uniformly dissolving the constituents as listed in Table 1 (positive tone resin composition) or Table 2 (negative tone resin composition) and filtering the solution through a membrane filter having a pore diameter of 0.2 μm.

Each composition solution was then spin-coated on a silicon wafer, followed by PB, exposure, and PEB treatment under conditions given in Table 3 (positive tone resin composition) or Table 4 (negative tone resin composition). The spin-coating speed was adjusted to control the resist coat thickness to 0.7 μm after the PB. After that, an alkali development was performed using a 2.38% (by weight) aqueous solution of tetramethyl ammoniumhydroxide at 23° C. for 1 minute, followed by washing with purified water for 30 seconds and drying to obtain resist patterns in the end.

The evaluation results for Examples and Comparative Examples are summarized in Table 5 (positive tone resin composition) and Table 6 (negative tone resin composition).

TABLE 1

| | Positive tone resin compositions | | | | |
|---|---|---|---|---|---|
| | Acid-decomposable group-containing resin and other additives (Part) | Acid generator (Part) | | Acid diffusion controller (Part) | Solvent (Part) |
| | | B1 | B2 | | |
| Example 1 | A-1 (100) | B1-1 (0.5) | B2-2 (2) B2-3 (2) | β-1 (0.4) | γ-1 (400) γ-3 (150) |
| Example 2 | A-1 (100) | B1-2 (0.7) | B2-5 (4) | β-1 (0.4) | γ-2 (550) |
| Example 3 | A-1 (100) | B1-3 (0.5) B1-10 (0.5) | B2-6 (2) | β-1 (0.4) | γ-1 (600) |
| Example 4 | A-2 (90) A-6 (10) | B1-4 (0.4) B1-7 (0.1) | B2-4 (5) | β-1 (0.4) | γ-1 (400) γ-3 (150) |
| Example 5 | A-3 (100) | B1-8 (0.5) | B2-1 (2) B2-6 (5) | β-1 (0.1) β-2 (0.2) | γ-1 (400) γ-3 (150) |
| Example 6 | A-3 (90) α-1 (10) | B1-1 (0.5) B1-2 (0.1) | B2-2 (2) B2-3 (2) | β-1 (0.4) | γ-1 (600) |
| Example 7 | A-4 (85) A-6 (15) | B1-5 (0.5) | B2-5 (2) | β-1 (0.4) | γ-1 (300) γ-2 (250) |
| Example 8 | A-5 (100) | B1-9 (1.5) | B2-2 (2) | β-1 (0.4) | γ-1 (400) γ-3 (150) |
| Example 9 | A-5 (100) | B1-1 (0.3) | B2-2 (2) B2-3 (2) | β-2 (0.3) | γ-1 (550) |

TABLE 1-continued

Positive tone resin compositions

| | Acid-decomposable group-containing resin and other additives (Part) | Acid generator (Part) B1 | Acid generator (Part) B2 | Acid diffusion controller (Part) | Solvent (Part) |
|---|---|---|---|---|---|
| Example 10 | A-5 (100) | B1-3 (0.5) | B2-1 (5) | β-2 (0.3) | γ-1 (300) γ-2 (250) |
| Example 11 | A-3 (100) | B1-1 (1) | B2-6 (6) | β-1 (0.2) | γ-2 (550) |
| Example 12 | A-1 (70) A-5 (30) | B1-4 (1) | B2-1 (0.5) B2-6 (6) | — | γ-1 (400) γ-3 (150) |
| Example 13 | A-5 (100) | B1-1 (2) | B2-2 (2) B2-3 (2) | — | γ-1 (400) γ-3 (150) |
| Comparative Example 1 | A-1 (100) | — | B2-2 (2) B2-3 (2) | β-1 (0.4) | γ-1 (400) γ-3 (150) |
| Comparative Example 2 | A-3 (100) | — | B2-1 (2) B2-6 (5) | β-1 (0.1) β-2 (0.2) | γ-1 (400) γ-3 (150) |

TABLE 2

Negative tone resin compositions

| | Alkali-soluble resin (Part) | Cross-linking agent (Part) | Acid generator (Part) B1 | Acid generator (Part) B2 | Acid diffusion controller (Part) | Solvent (Part) |
|---|---|---|---|---|---|---|
| Example 14 | C-1 (100) | D-1 (7) | B1-3 (0.4) | B2-1 (3) | β-1 (0.7) | γ-1 (400) γ-3 (150) |
| Example 15 | C-1 (100) | D-2 (7) | B1-9 (0.5) | B2-4 (8) | β-1 (0.7) | γ-2 (550) |
| Example 16 | C-1 (30) C-2 (70) | D-2 (7) | B1-1 (0.2) | B2-6 (6) | β-1 (0.7) | γ-1 (550) |
| Example 17 | C-1 (30) C-2 (70) | D-2 (7) | B1-4 (0.4) | B2-3 (4) | β-1 (0.7) | γ-1 (400) γ-3 (150) |
| Example 18 | C-2 (100) | D-1 (7) | B1-7 (0.5) | B2-6 (8) | β-1 (0.7) | γ-1 (400) γ-3 (150) |
| Comparative Example 3 | C-1 (100) | D-2 (7) | — | B2-4 (8) | β-1 (0.7) | γ-2 (550) |
| Comparative Example 4 | C-1 (30) C-2 (70) | D-2 (7) | — | B2-6 (6) | β-1 (0.7) | γ-1 (550) |

TABLE 3

Evaluation conditions for positive tone resin compositions

| | PB Temperature (° C.) | PB Time (sec.) | Radiation for exposure | PEB Temperature (° C.) | PEB Time (sec.) |
|---|---|---|---|---|---|
| Example 1 | 90 | 90 | KrF excimer laser (Wavelength: 248 nm) (*1) | 90 | 90 |
| Example 2 | 80 | 90 | Same as above | 100 | 90 |
| Example 3 | 90 | 90 | Same as above | 100 | 90 |
| Example 4 | 90 | 60 | Same as above | 110 | 60 |
| Example 5 | 110 | 90 | Same as above | 110 | 90 |
| Example 6 | 90 | 90 | Same as above | 90 | 180 |
| Example 7 | 130 | 90 | Same as above | 130 | 90 |
| Example 8 | 130 | 90 | Same as above | 145 | 60 |
| Example 9 | 140 | 90 | Same as above | 140 | 120 |
| Example 10 | 130 | 90 | Same as above | 140 | 90 |
| Example 11 | 90 | 60 | Same as above | 100 | 60 |
| Example 12 | 90 | 60 | Same as above | 110 | 60 |
| Example 13 | 140 | 60 | Electron beam (Acceleration voltage: 50 KeV) (*2) | 140 | 60 |
| Comparative Example 1 | 90 | 90 | KrF excimer laser (Wavelength: 248 nm) (*1) | 90 | 90 |
| Comparative Example 2 | 110 | 90 | Same as above | 110 | 90 |

(*1) With the stepping projection aligner Model NSR2005EX08A, manufactured by Nikon Corp.
(*2) With a direct-writing electron beam lithography system

TABLE 4

Evaluation conditions for negative tone resin compositions

| | PB | | | PEB | |
|---|---|---|---|---|---|
| | Temperature (° C.) | Time (sec.) | Radiation for exposure | Temperature (° C.) | Time (sec.) |
| Example 14 | 90 | 90 | KrF excimer laser (Wavelength: 248 nm) (*1) | 110 | 90 |
| Example 15 | 90 | 90 | Same as above | 110 | 90 |
| Example 16 | 90 | 90 | Same as above | 110 | 90 |
| Example 17 | 90 | 60 | Same as above | 110 | 60 |
| Example 18 | 90 | 90 | Same as above | 110 | 90 |
| Comparative Example 3 | 90 | 90 | KrF excimer laser (Wavelength: 248 nm) (*1) | 110 | 90 |
| Comparative Example 4 | 90 | 90 | Same as above | 110 | 90 |

(*1) With the stepping projection aligner Model NSR2005EX08A, manufactured by Nikon Corp.

TABLE 5

Evaluation results for positive tone resin compositions

| | Resolution ($\mu$m) | Pattern profile | Coating surface roughness $\Delta$L ($\mu$m) |
|---|---|---|---|
| Example 1 | 0.20 | Good | Good |
| Example 2 | 0.22 | Good | Good |
| Example 3 | 0.22 | Good | Good |
| Example 4 | 0.22 | Good | Good |
| Example 5 | 0.20 | Good | Good |
| Example 6 | 0.22 | Good | Good |
| Example 7 | 0.22 | Good | Good |
| Example 8 | 0.22 | Good | Good |
| Example 9 | 0.20 | Good | Good |
| Example 10 | 0.23 | Good | Good |
| Example 11 | 0.20 | Good | Good |
| Example 12 | 0.20 | Good | Good |
| Example 13 | 0.20 | Good | Good |
| Comparative Example 1 | 0.22 | Poor Lb/La < 0.85 | Poor $\Delta$L = 0.023 |
| Comparative Example 2 | 0.24 | Good | Poor $\Delta$L = 0.035 |

TABLE 6

Evaluation results for negative tone resin compositions

| | Resolution ($\mu$m) | Pattern profile | Coating surface roughness $\Delta$L ($\mu$m) |
|---|---|---|---|
| Example 1 | 0.20 | Good | Good |
| Example 2 | 0.22 | Good | Good |
| Example 3 | 0.20 | Good | Good |
| Example 4 | 0.22 | Good | Good |
| Example 5 | 0.20 | Good | Good |
| Comparative Example 3 | 0.24 | Poor Lb/La > 1.1 | Poor $\Delta$L = 0.019 |
| Comparative Example 4 | 0.24 | Good | Poor $\Delta$L = 0.033 |

The positive tone resin composition and the negative tone resin composition of the present invention are, in addition to being capable of providing excellent resolution and pattern profile, particularly excellent in avoiding the problems of "nano-edge roughness" or "coating surface roughness". The radiation sensitive resin compositions of the present invention also respond efficiently to various radioactive rays such as ultraviolet rays, far ultraviolet rays, X-rays, or charged particle rays. The positive tone as well as negative tone resin compositions in the present invention, therefore, can be used exceedingly advantageously as chemically amplified resists for use in the manufacture of semiconductor devices which are expected to further deepen the degree of microfabrication in future.

Obviously, numerous modifications and variations of the present invention are possible in light of the above teachings. It is therefore to be understood that within the scope of the appended claims, the invention may be practiced otherwise than as specifically described herein.

What is claimed is:

1. A positive radiation sensitive resin composition comprising:

(A) (a) an alkali-insoluble or alkali low-soluble resin protected by an acid-decomposable group and turning alkali-soluble when said acid-decomposable group is decomposed or (b) an alkali-soluble resin and an alkali dissolution controller; and (B) a photoacid generator comprising two or more chemical compounds, one being a compound which upon exposure to radiation generates a carboxylic acid having a boiling point of 150° C. or higher under atmospheric pressure and the other a compound which upon exposure to radiation generates an acid other than a carboxylic acid;

wherein said alkali-insoluble or alkali low-soluble resin contains an acidic functional group in which the hydrogen atoms are replaced with one or more acid-decomposable groups, wherein said acidic functional group is a phenolic hydroxyl group or carboxylic group, wherein said acid decomposable group is selected from the group consisting of substituted methyl groups, 1-substituted ethyl groups, 1-branched alkyl groups, silyl groups, germyl groups, alkoxycarbonyl groups, acyl groups, cyclic acid decomposable groups, t-butyl group, t-butoxycarbonyl group, t-butoxycarbonylmethyl group, and 1-ethoxymethyl group, and wherein said compound which upon exposure to radiation generates a carboxylic acid is an iodonium salt or sulfonium salt.

2. The positive radiation sensitive resin composition according to claim 1, wherein the inclusion rate of said acid-decomposable group in the alkali-insoluble or alkali low-soluble resin, in terms of the ratio of the number of acid-decomposable groups to the combined number of the acidic functional groups and the acid-decomposable groups contained in the resin, is from 10 to 100%.

3. The positive radiation sensitive resin composition according to claim 1, wherein said alkali-soluble resin is an addition-polymerized type resin having one or more recurring units represented by the following formulae (3) to (5):

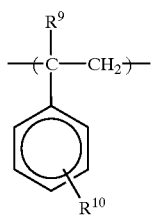

(3)

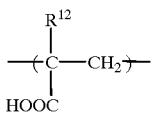

(4)

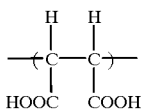

(5)

wherein $R^9$ is a hydrogen atom or methyl group; $R^{10}$ is —OH, —COOH, —$R^{11}$COOH, —O$R^{11}$COOH, or —OCO$R^{11}$COOH, in which $R^{11}$ is —(CH)$_g$—, with g representing an integer from 1 to 4, and wherein $R^{12}$ is a hydrogen atom or methyl group.

4. The positive radiation sensitive resin composition according to claim 1, wherein said alkali-soluble resin is a polycondensated resin having one or more recurring units represented by the following formula (6):

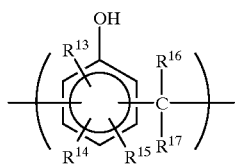

(6)

wherein $R^{13}$, $R^{14}$, $R^{15}$, $R^{16}$ and $R^{17}$ may be identical or different, and are each independently a hydrogen atom or an alkyl group having 1 to 4 carbon atoms.

5. The positive radiation sensitive resin composition according to claim 1, wherein said alkali dissolution controller is a compound containing an acidic functional group of which the hydrogen atoms have been replaced by at least one type of acid decomposable group which is decomposed in the presence of an acid.

6. The positive radiation sensitive resin composition according to claim 5, wherein said acid-decomposable group is selected from the group consisting of substituted methyl groups, 1-substituted ethyl groups, 1-branched alkyl groups, silyl groups, germyl groups, alkoxycarbonyl groups, acyl groups, and cyclic acid-decomposable groups.

7. The positive radiation sensitive resin composition according to claim 1, wherein said carboxylic acid having a boiling point of 150° C. or higher under atmospheric pressure is selected from the group consisting of unsaturated aliphatic carboxylic acids, saturated aliphatic carboxylic acids, halogen-containing aliphatic carboxylic acids, hydroxyl group-containing aliphatic carboxylic acids, alkoxyl group-containing aliphatic carboxylic acids, keto group-containing aliphatic carboxylic acids, aldehyde group-containing aliphatic carboxylic acids, alicyclic structure-containing aliphatic carboxylic acids, aromatic ring-containing conjugate carboxylic acids, and aromatic ring-containing non-conjugate carboxylic acids.

8. The positive radiation sensitive resin composition according to claim 1, wherein said compound which upon exposure to radiation generates an acid other than a carboxylic acid is selected from the group consisting of onium salt compounds, sulfone compounds, sulfonate compounds, sulfonimide compounds, and diazomethane compounds.

9. The positive radiation sensitive resin composition according to claim 1, wherein said compound which upon exposure to radiation generates an acid other than a carboxylic acid is selected from the group consisting of onium salt compounds and diazomethane compounds.

10. A negative radiation sensitive resin composition comprising:
   (C) an alkali-soluble resin,
   (D) a compound capable of cross-linking an alkali-soluble resin in the presence of an acid, and
   (B) a photoacid generator comprising two or more chemical compounds, one being a compound which upon exposure to radiation generates a carboxylic acid having a boiling point of 150° C. or higher under atmospheric pressure and the other a compound which upon exposure to radiation generates an acid other than a carboxylic acid,
   wherein said compound which upon exposure to radiation generates an acid other than a carboxylic acid is a sulfonimide compound.

11. The negative radiation sensitive resin composition according to claim 10, wherein said compound capable of cross-linking an alkali-soluble resin in the presence of an acid is a compound containing a cross-linking substituent which is selected from the group consisting of a glycidyl ether group, glycidyl ester group, glycidyl amino group, methoxymethyl group, ethoxymethyl group, benzyloxymethyl group, dimethylaminomethyl group, diethylaminomethyl group, dimethylolaminomethyl group, diethylolaminomethyl group, morpholinomethyl group, acetoxymethyl group, benzoyloxymethyl group, formyl group, acetyl group, vinyl group, and isopropenyl group.

12. The negative radiation sensitive resin composition according to claim 10, wherein said carboxylic acid having a boiling point of 150° C. or higher under atmospheric pressure is selected from the group consisting of unsaturated aliphatic carboxylic acids, saturated aliphatic carboxylic acids, halogen-containing aliphatic carboxylic acids, hydroxyl group-containing aliphatic carboxylic acids, alkoxyl group-containing aliphatic carboxylic acids, keto group-containing aliphatic carboxylic acids, aldehyde group-containing aliphatic carboxylic acids, alicyclic structure-containing aliphatic carboxylic acids, aromatic ring-containing conjugate carboxylic acids, and aromatic ring-containing non-conjugate carboxylic acids.

* * * * *